(12) United States Patent
Ruby et al.

(10) Patent No.: US 7,275,292 B2
(45) Date of Patent: Oct. 2, 2007

(54) METHOD FOR FABRICATING AN ACOUSTICAL RESONATOR ON A SUBSTRATE

(75) Inventors: Richard C. Ruby, Menlo Park, CA (US); John D. Larson, Palo Alto, CA (US); Paul D. Bradley, Mountain View, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 90 days.

(21) Appl. No.: 10/384,199

(22) Filed: Mar. 7, 2003

(65) Prior Publication Data

US 2004/0172798 A1 Sep. 9, 2004

(51) Int. Cl.
- *H04R 17/00* (2006.01)
- *H01L 41/00* (2006.01)
- *B05D 5/12* (2006.01)

(52) U.S. Cl. .................. 29/25.35; 29/594; 29/846; 29/947; 310/321; 427/100

(58) Field of Classification Search .............. 29/25.35, 29/594, 846, 847; 310/321, 324, 348, 349, 310/363; 333/189, 187; 438/959; 216/13, 216/38, 40, 41–49; 427/100
See application file for complete search history.

(56) References Cited

U.S. PATENT DOCUMENTS

| | | | | |
|---|---|---|---|---|
| 3,590,287 | A | * | 6/1971 | Berlincourt et al. ........ 310/321 |
| 4,320,365 | A | * | 3/1982 | Black et al. ................ 333/187 |
| 4,906,840 | A | * | 3/1990 | Zdeblick et al. ............ 250/306 |
| 5,129,132 | A | * | 7/1992 | Zdeblick et al. ............ 29/25.35 |
| 5,465,725 | A | * | 11/1995 | Seyed-Bolorforosh ...... 600/459 |
| 5,587,620 | A | * | 12/1996 | Ruby et al. ................ 310/346 |
| 5,692,279 | A | * | 12/1997 | Mang et al. ............... 29/25.35 |
| 5,714,917 | A | | 2/1998 | Ella |
| 5,853,601 | A | * | 12/1998 | Krishaswamy et al. ........ 216/2 |
| 5,872,493 | A | * | 2/1999 | Ella ........................... 333/191 |
| 5,873,153 | A | * | 2/1999 | Ruby et al. ................ 29/25.35 |
| 6,060,818 | A | * | 5/2000 | Ruby et al. ................ 310/363 |
| 6,111,480 | A | * | 8/2000 | Iyama et al. ................ 333/188 |
| 6,262,637 | B1 | | 7/2001 | Bradley et al. |
| 6,278,342 | B1 | | 8/2001 | Ella |
| 6,307,447 | B1 | * | 10/2001 | Barber et al. ............... 333/189 |
| 6,407,649 | B1 | | 6/2002 | Tikka et al. |
| 6,414,569 | B1 | | 7/2002 | Nakafuku |
| 6,566,979 | B2 | | 5/2003 | Larson et al. |
| 6,601,276 | B2 | | 8/2003 | Barber |
| 6,828,713 | B2 | | 12/2004 | Bradley et al. |
| 6,842,088 | B2 | | 1/2005 | Yamada et al. |

\* cited by examiner

*Primary Examiner*—A. Dexter Tugbang
*Assistant Examiner*—Tai Van Nguyen

(57) ABSTRACT

Method for fabricating an acoustical resonator on a substrate having a top surface. First, a depression in said top surface is generated. Next, the depression is filled with a sacrificial material. The filled depression has an upper surface level with said top surface of said substrate. Next, a first electrode is deposited on said upper surface. Then, a layer of piezoelectric material is deposited on said first electrode. A second electrode is deposited on the layer of piezoelectric material using a mass load lift-off process.

11 Claims, 14 Drawing Sheets

METHOD FOR FABRICATING AN ACOUSTICAL RESONATOR ON A SUBSTRATE

FIELD OF THE INVENTION

The present invention relates generally to acoustic resonators, and more particularly, to resonators that may be used as filters for electronic circuits and a method of manufacturing the same.

BACKGROUND OF THE INVENTION

The need to reduce the cost and size of electronic equipment has led to a continuing need for smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that has the potential for meeting these needs is constructed from acoustic resonators. These devices use bulk longitudinal acoustic waves in thin film piezoelectric (PZ) material. In one simple configuration, a layer of PZ material is sandwiched between two metal electrodes. The sandwich structure is suspended in air by supporting it around the perimeter. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a filter. The mechanical resonant frequency is that for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions less than 100 microns in diameter and few microns in thickness.

At the heart of Thin Film Bulk Acoustic Resonators (FBARs) and Stacked Thin Film Bulk Wave Acoustic Resonators and Filters (SBARs) is a thin sputtered piezoelectric film having a thickness on the order of one to two microns. Electrodes on top and bottom sandwich the piezoelectric acting as electrical leads to provide an electric field through the piezoelectric. The piezoelectric, in turn, converts a fraction of the electric field into a mechanical field. A time varying "stress/strain" field will form in response to a time-varying applied electric field.

To act as a resonator, the sandwiched piezoelectric film must be suspended in air to provide the air/crystal interface that traps the sound waves within the film. The device is normally fabricated on the surface of a substrate by depositing a bottom electrode, the PZ layer, and then the top electrode. Hence, an air/crystal interface is already present on the topside of the device. A second air/crystal interface must be provided on the bottom side of the device.

A publication entitled, "Bulk Acoustic Resonators and Filters for Wireless Applications," by K. Lakin, State-of-the-Art Filter Design Using EM and Circuit Simulation Techniques, 2001 IEEE International Microwave Symp. Workshop Notes, MTT-8, Filters and Passive Components, May 20, 2001, describes the general features of thin film resonator (TFR) technology.

There are basically two types of thin film resonators (TFRs): the membrane type and the mirror type. The mirror type is also referred to as a solidly mounted resonator (SMR). The membrane type of TFR has an advantage over the SMR type in that the membrane type of TFR has a better energy confinement due to the air interface on both sides of the piezolayer. The improved energy confinement enables higher coupling coefficients that lead to larger filter bandwidth.

Unfortunately, the fabrication of these membrane structures is very complex. The challenges in the manufacturing process for these types of structures include 1) depositing multiple films with severe constraints on smoothness; 2) being able to accurately measure and monitor the thickness of each layer (especially multiple layers; 3) manufacturing a high-volume, high throughput process that is amenable to multiple depositions in one process step. This last step is important when planning for capacity; 4) finding compatible metals, piezoelectric materials, and the release material, 5) very thin (~0.5 micrometer) AlN dielectric layer leading to electro-static breakdown problems; 6) providing robust anchor points for the suspended membranes without introducing significant acoustic energy drain (lowers device Q); 7) aligning the various layers so that there are no "ghost" FBAR segments that might resonate at slightly different frequencies. For these reasons, the state of the art for manufacturing thin film resonators has opted for the SMR structure over the membrane type of structure.

There are numerous publications that describe different aspects of the manufacture of SMR structures. For example, a publication entitled, "ZnO Based Thin Film Bulk Acoustic Wave Filters for EGSM Band" by J. Kaitila, M. Ylilammi, J. Molarius, J. Ella, and T. Makkonen, Ultrasonics Symposium 2001 describes ZnO based filters that have a solidly mounted resonator structure.

Another publication entitled, "Temperature Compensated Bulk Acoustic Thin Film Resonators" by K. M. Lakin, K. T. McCarron, and J. F. McDonald, 2000 IEEE Ultrasonics Symp. Proc., pp. 855-858, Oct. 22-25, 2000, Caribe Hilton, San Juan, Puerto Rico, describes temperature compensated TFRs that have a solidly mounted resonator structure.

Another publication entitled, "Filter Banks Implemented with Integrated Thin Film Resonators" by K. M. Lakin, K. T. McCarron, J. Belsick and R. Rose, 2000 IEEE Ultrasonics Symp. Proc., pp. 851-854, Oct. 22-25, 2000, Caribe Hilton, San Juan, Puerto Rico, describes filter banks with TFR that have a solidly mounted resonator structure.

Based on the foregoing, there remains a need for a process to manufacture acoustic resonators that overcomes the disadvantages set forth previously.

SUMMARY OF THE INVENTION

According to one embodiment of the present invention, a method for fabricating an acoustical resonator on a substrate having a top surface is described. First, a depression in said top surface is generated. Next, the depression is filled with a sacrificial material. The filled depression has an upper surface level with said top surface of said substrate. Next, a first electrode is deposited on said upper surface. Then, a layer of piezoelectric material is deposited on said first electrode. A second electrode is deposited on the layer of piezoelectric material using a mass load lift-off process.

According to a second embodiment of the present invention, the second electrode is patterned by utilizing a photo resist mask. The hard mask layer is deposited after the second electrode layer. The hard mask is then patterned, and the patterned hard mask is subsequently employed to etch the second electrode. The hard mask serves also as a passivation layer.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A manufacturing process for thin film bulk acoustic resonator (fbar) filters is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

General Processing Flow and Structure

Figure 1:
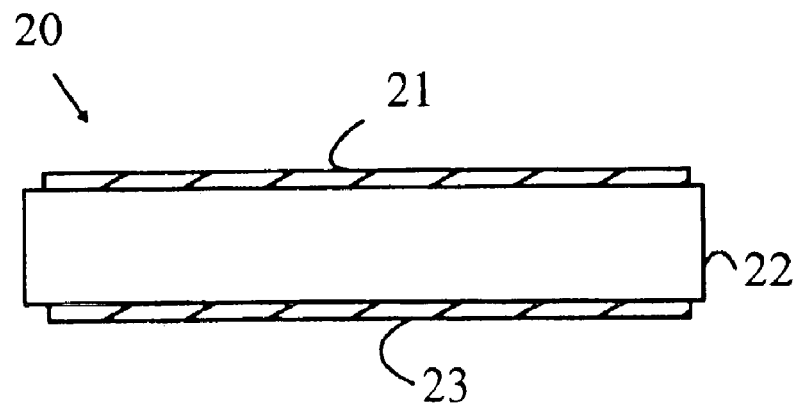
FIG. 1 is a cross-section of FBAR resonator.
Figure 2:
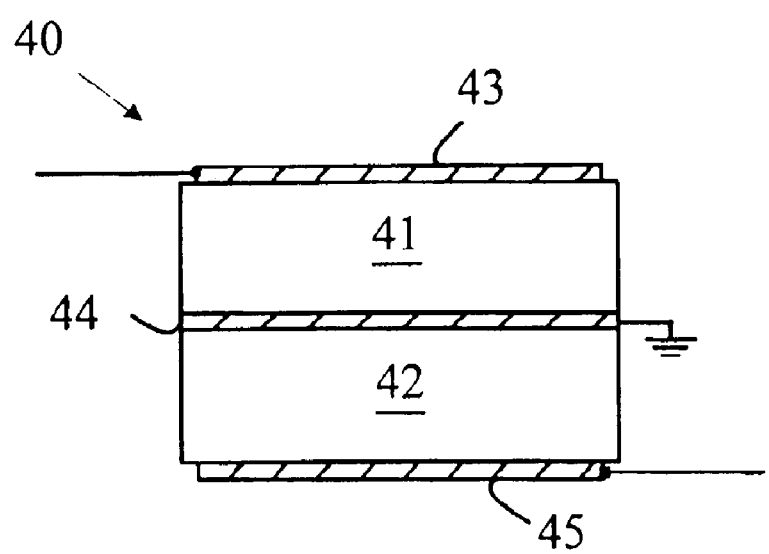
FIG. 2 is a cross-section of an SBAR resonator.

The present invention may be more easily understood with reference to FIGS. 1 and 2, which are cross-sectional views of an FBAR and an SBAR, respectively. Referring to FIG. 1, FBAR 20 includes bottom and top electrodes 23 and 21, respectively, which sandwich a portion of a sheet of piezoelectric (PZ) material 22. The preferred PZ material is aluminum nitride (AlN). The electrodes used in resonator 20 are preferably made of Molybdenum (Mo). However, in other embodiments, the electrodes can be manufactured with other materials, such as, but not limited to, Tungsten (W), Gold (Au), Titanium (Ti), Aluminum (Al), Platinum (Pt), Vanadium (V), Copper (Cu), and Titanium Nitride (TiN).

These devices use bulk longitudinal acoustic waves in the thin film PZ material. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a notch filter. The mechanical resonant frequency is the frequency for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions of the order of 100 microns and few microns in thickness.

Referring now to FIG. 2, which is a cross-sectional view of an SBAR 40. An SBAR provides electrical functions analogous to those of a band-pass filter. SBAR 40 basically includes two FBAR filters that are mechanically coupled. A signal across electrodes 43 and 44 at the resonance frequency of PZ layer 41 transmits acoustical energy to PZ layer 42. The mechanical oscillations in PZ layer 42 are converted to an electrical signal across electrodes 44 and 45 by the PZ material.

The manner in which an FBAR and SBAR are constructed according to the present invention may be more easily understood with reference to FIGS. 3-7, which are cross-sectional views of a portion of a wafer 101 on which an FBAR 110 is constructed by the method of the present invention. The present invention utilizes a sacrificial layer comprising a material that is much more easily etched than the thermal oxides utilized in prior art methods based on sacrificial layers. In the preferred embodiment of the present invention, the sacrificial layer is constructed from phosphor-silica-glass (PSG).

Figure 3:
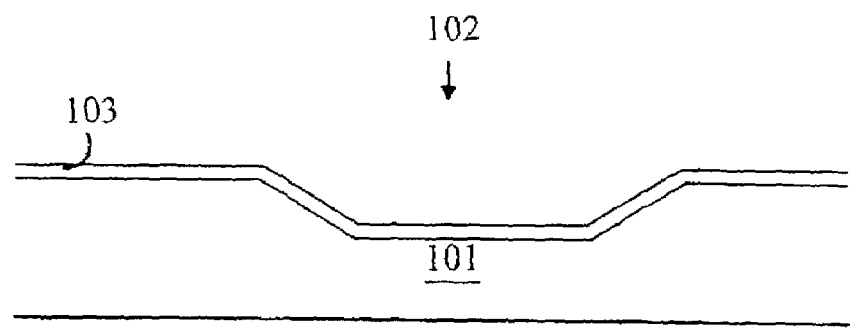
FIGS. 3-7 are cross-sectional views of a portion of a wafer on which an FBAR is constructed by a general processing method according to one embodiment of the present invention.

Referring to FIG. 3, a pit 102 is etched into substrate 101, which is preferably a conventional silicon wafer of the type utilized in integrated circuit fabrication. The pit is preferably less than 30 microns. It should be noted that the depth of the cavity under the FBAR needs to be only sufficient to accommodate the displacement created by the piezoelectric layer. Hence, a pit having a depth of a few microns is sufficient.

A thin layer of thermal oxide 103 is grown on the surface of the wafer to prevent phosphorous from the PSG from diffusing into the layer. Such diffusion would convert the silicon to a conductor, which would interfere with the electrical operation of the final device.

Figure 4:
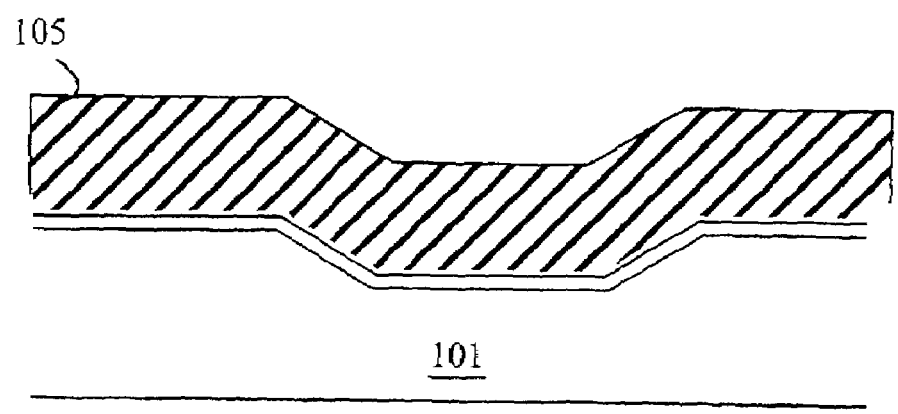

Referring to FIG. 4, a PSG layer is then deposited over the wafer. The PSG is deposited at a temperature of about 450 degrees Celsius using a silane and $P_2O_5$ sources to form a soft glass like material, which is approximately 8% phosphorous. This low temperature process is well known to those skilled in the art, and hence, will not be discussed in detail here. The PSG is the preferred choice for a sacrificial layer because it is a very clean, inert material that can be deposited at the relatively low temperature and can be etched in a dilute $H_2$:HF solution at a very high etch rate. At a dilution ratio of 10:1, etch rates on the order of 3 microns per minute are obtained.

Unfortunately, a native PSG sacrificial layer is a poor base for constructing an acoustical resonator. At the atomic level the surface of such deposited films are atomically very rough. An acoustical resonator of the FBAR/SBAR type requires a piezoelectric material in which the crystals grow in columns that are perpendicular to the plane of the electrodes. Attempts to grow well-collimated piezoelectric films on the surface of a PSG layer result, at best, in poor polycrystalline material that exhibits little or no piezoelectric effects because the many facets on the rough surface initiate crystal growth in a variety of directions.

Figure 5:
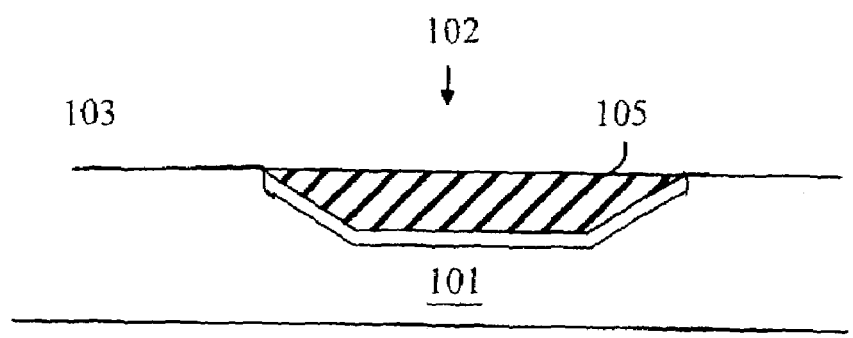

The present invention overcomes this difficulty by polishing the PSG surface to provide an atomically smooth surface. Referring to FIG. 5, the surface of the PSG layer 105 is first planarized by polishing with a slurry to remove the portion of the PSG layer and oxide outside of pit 102. The remaining PSG can then be polished using a more refined slurry. Alternatively, a single more refined slurry can be used for both polishing steps if the additional polishing time is not objectionable. The goal is to create a "mirror" like finish.

The cleaning of these wafers is also important part of the processing steps of the present invention. The slurry leaves bits of silica grit on the wafer. This grit is preferably removed. In the preferred embodiment of the present invention, this is accomplished by using a second polishing wheel with a stiff, hard pad such as Polytex™ (Rodel, Conn.) De-ionized water is used as the lubricant. After being polished, the wafers are kept in de-ionized water until ready for the final cleaning step. The wafers should not be allowed to dry between the last polish step and the last cleaning step. The last cleaning step consists of dipping the wafers in a series of tanks that hold various chemicals. Each tank is subjected to ultrasonic agitation. Such cleaning benches are well known to the art, and hence, will not be discussed in detail here. A cleaning bench of the Megasonic™ type available from Ameramade, California has been found to be adequate.

The present invention is based on the surprising finding that such a smooth surface provides a base for the deposition of highly textured c-axis piezoelectric material demonstrating excellent piezoelectric properties in spite of the fact that it does not contain a crystalline structure that "seeds" the piezoelectric layer.

The grit consists of silica particulates. In the preferred embodiment of the present invention, a slurry made by Rodel (#1508), which is an ammonia-based slurry of silica particulates, is utilized.

While the above discussion has indicated a specific polishing and cleaning regime, any polishing and cleaning regime which provides a surface of the requisite smoothness may be utilized. In the preferred embodiment of the present invention, the final surface has a RMS (root-mean-squared) variation in height of less than 0.5 microns as measured with an atomic force microscope probe.

Figure 6:
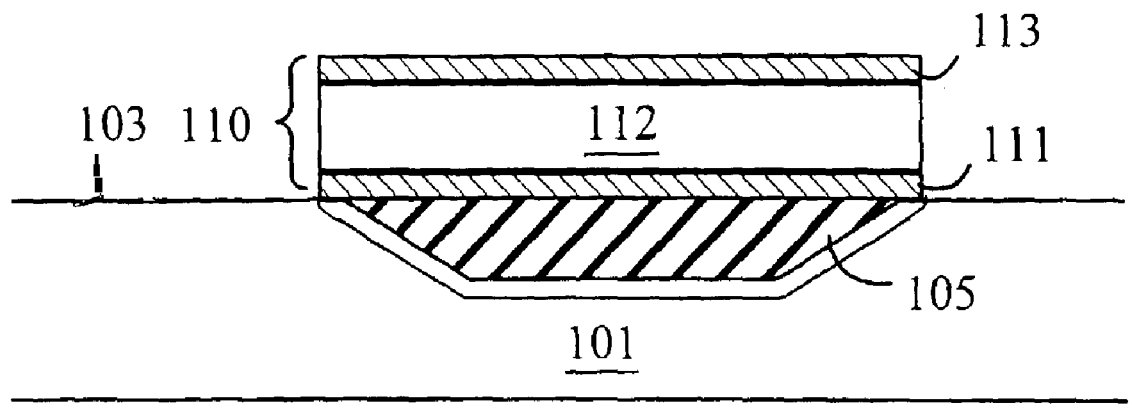

After the surface is cleaned, the bottom electrode 111 of the FBAR 110 is deposited as shown in FIG. 6. The preferred electrode material is molybdenum. However, other materials will be apparent to those skilled in the art. For example, the electrodes may be constructed from Al, W, Au, Pt, or Ti. Molybdenum is preferred because of its low thermo-elastic loss, and etch compatibility with AlN. For example, Mo has approximately 56 times less thermo-elastic loss than Al.

After the bottom electrode has been deposited, the piezoelectric layer 112 is deposited. The preferred material for the piezoelectric layer is AlN, which is also deposited by sputtering. Since the deposition of AlN to form a piezoelectric layer is well known in the art, this deposition process will not be discussed in detail here. In the preferred embodiment of the present invention, the piezoelectric layer has a thickness between 0.1 and 10 microns.

Finally, the top electrode 113 is deposited. The top electrode is also preferably constructed from Mo.

Figure 7:
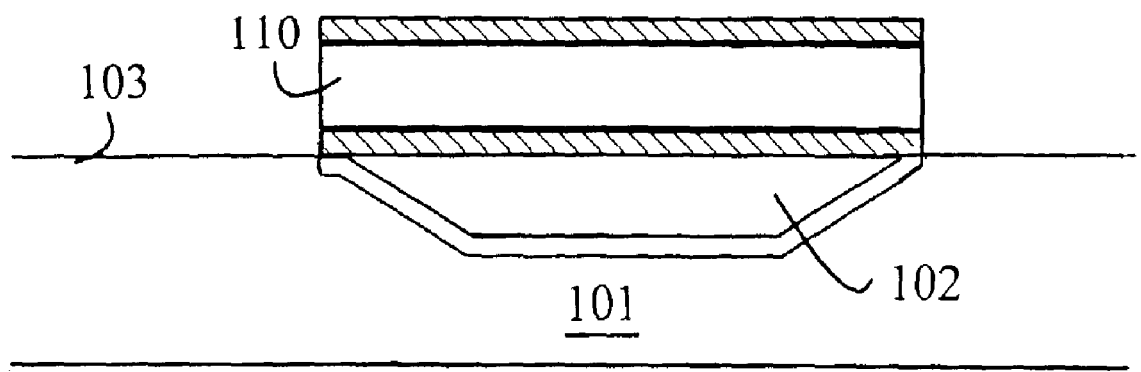

After the FBAR structure is deposited, vias are opened to the underlying sacrificial layer 105 and the PSG removed by etching in dilute $H_2O:HF$ solution as shown in FIG. 7. This leaves FBAR 110 suspended over the original pit 102.

The above example has utilized the construction of an FBAR. However, it will be obvious to those skilled in the art from the preceding discussion that an SBAR can be constructed utilizing the same process. In the case of an SBAR, an additional piezoelectric layer and electrode must be deposited. Since the second piezoelectric layer is constructed on the top electrode of the FBAR, the thickness of the top electrode should be selected to provide a suitable surface for depositing the second piezoelectric layer.

While the above-described embodiments of the present invention utilize a sacrificial layer constructed from PSG, other materials may also be used. For example, other forms of glass such as BPSG or spin-on-glass may be utilized. In addition, there are plastics such as polyvinyl, polypropylene and polystyrene that can be deposited either by spinning on the material or depositing in special chambers. These sacrificial layers can be removed using an organic stripper or $O_2$ plasma etch. As with the PSG sacrificial layer, polishing is also crucial with these materials, as the surfaces of these materials as deposited are not atomically smooth.

Processing Steps

Figure 8:
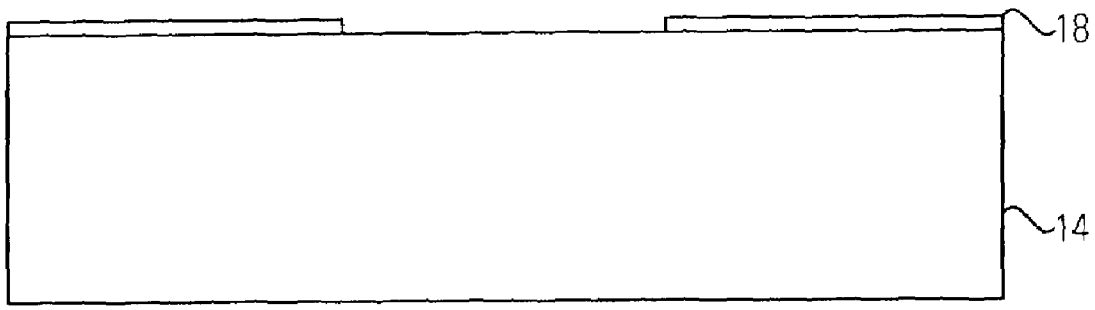
FIGS. 8-28 are cross-sectional views of a portion of a wafer on which an FBAR is constructed according to another embodiment of the present invention.

FIGS. 8-30 are cross-sectional views of a portion of a wafer on which an FBAR is constructed according to a first preferred embodiment of the present invention. Referring to FIG. 8, the starting material is a non-conductive substrate (hereinafter also referred to as a high resistivity substrate) 14. Preferably, the starting material is a high resistivity float zone silicon substrate 14. However, other materials of high resistivity, such as gallium arsenide (GaAs) may also be utilized. A first mask 18 for use in etching a depression (hereinafter also referred to as a swimming pool) is also shown. The first mask 18 is preferably a dark field mask that includes positive photo resist.

Figure 9:
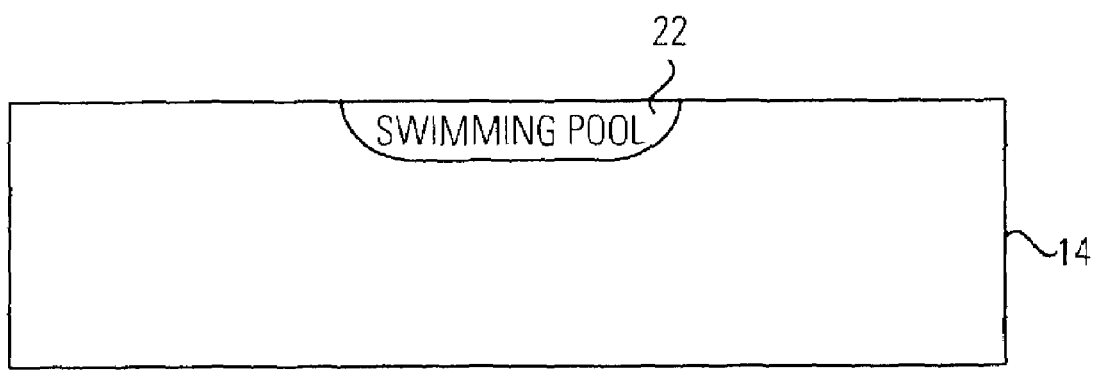

Referring to FIG. 9, a depression 22 or "swimming pool" is etched into the substrate 14. Preferably, a dry etch is utilized to each the depression 22. Any remaining photo resist of the first mask 18 is stripped. The ultimate purpose of the depression 22 is to provide for the suspension of a piezoelectric membrane over air.

Figure 10:
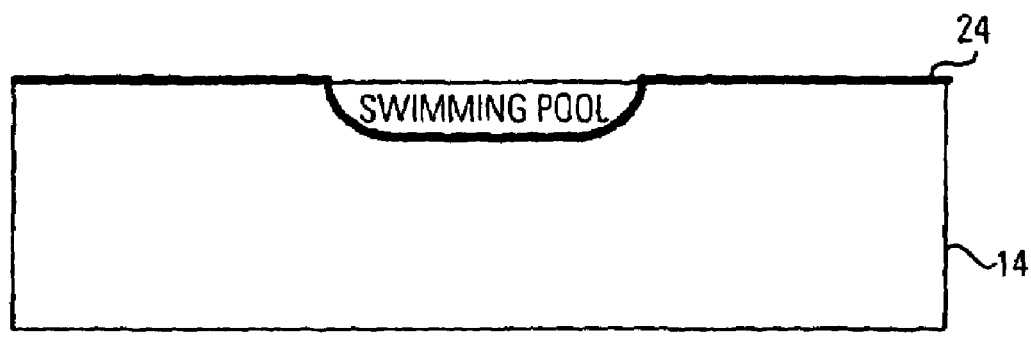

Referring to FIG. 10, a barrier layer 24 is formed on the top surface of the substrate 14. Preferably, the barrier layer 24 is thermal oxide having a thickness of about 2000 Angstroms. The barrier layer 24 prevents the diffusion of dopants, which are included in the material that is deposited in the next step, into the silicon substrate 14. This diffusion of dopants, if not prevented, would make the silicon surface conductive, thereby shunting the RF signal from the Film Bulk Acoustic Resonator (FBAR).

Figure 11:
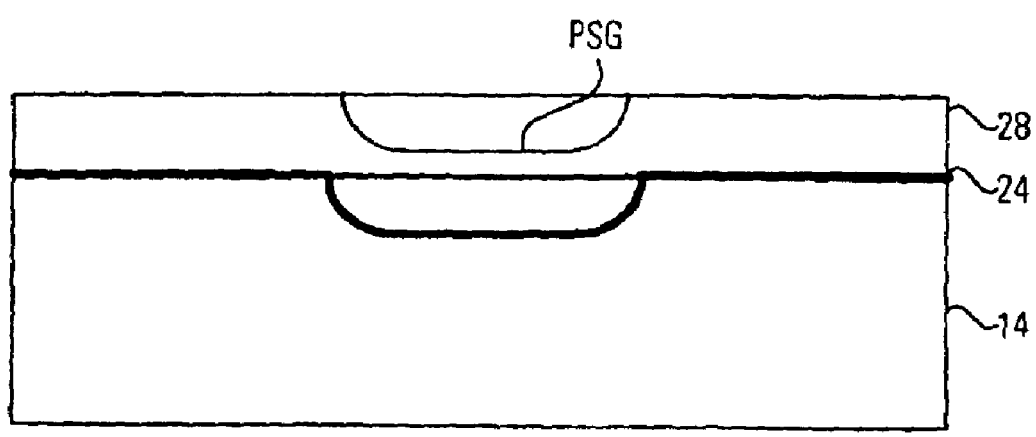

Referring to FIG. 11, a sacrificial layer phosphorous-doped silica glass (PSG) 28 is deposited on the barrier layer 24. The sacrificial layer 28 acts as a support material by which the membrane structure may be processed. The sacrificial layer is preferably a phosphorous-doped silicon glass (PSG) 28. Preferably, a 0% to 8% phosphorous silicon glass is deposited onto the wafer at about 400 degrees to 600 degrees. It is noted that phosphorous doping of PSG 28 affects the speed at which the material 28 etches is a dilute HF bath. As described in greater detail hereinafter, the swimming pool 22 is subsequently relieved of the material 28 by an etch step to leave air in the swimming pool 22.

Figure 12:
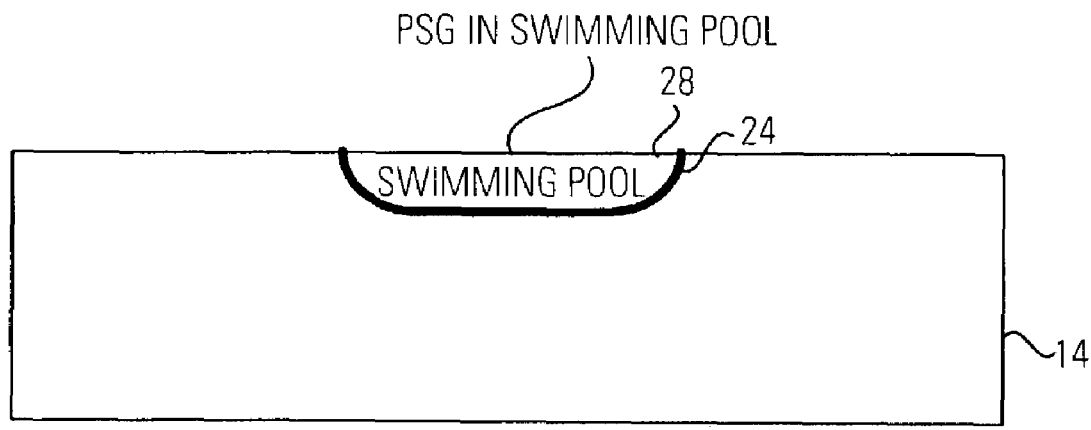

Referring to FIG. 12, a chemical mechanical polish (CMP) is performed on the surface to planarize the surface, thereby removing both the barrier layer 24 and the sacrificial layer 28 from the surface of the substrate. This step leaves the barrier layer 24 and the sacrificial material (PSG) 28 only in the depression 22. This step is described in greater detail in U.S. Pat. No. 6,060,818 entitled, "SBAR structures and method of fabrication of SBAR/FBAR film processing techniques for the manufacturing of SBAR/BAR filters," by Richard C. Ruby, Yogesh Desai, and Donald R. Bradbury.

Figure 13:
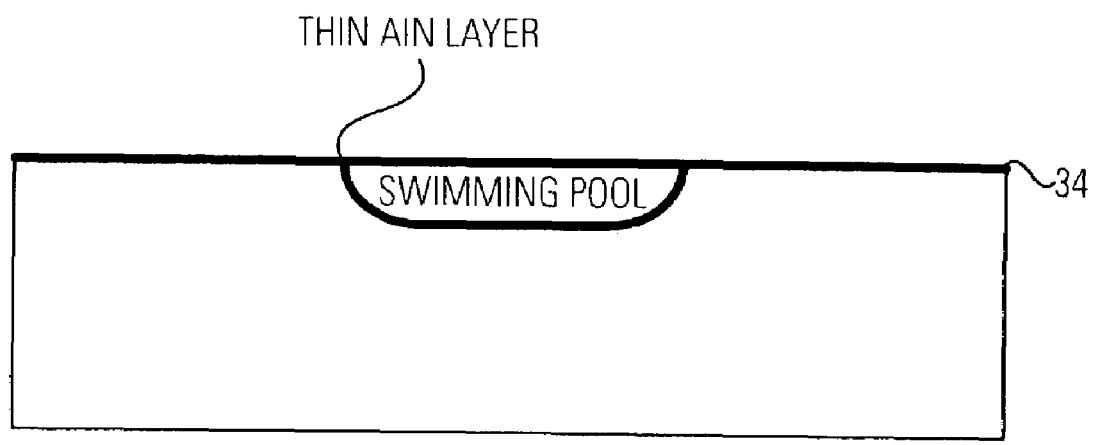

Referring to FIG. 13, a barrier layer 34 (also referred to as a seed layer) of aluminum nitride (AlN) or other suitable material, such as TiN, is then deposited on the polished surface using evaporation or other deposition process. Preferably, the seed layer 34 includes an aluminum nitride (AlN) layer having a thickness of several hundred Angstroms (e.g., about 300 Angstroms).

Figure 14:
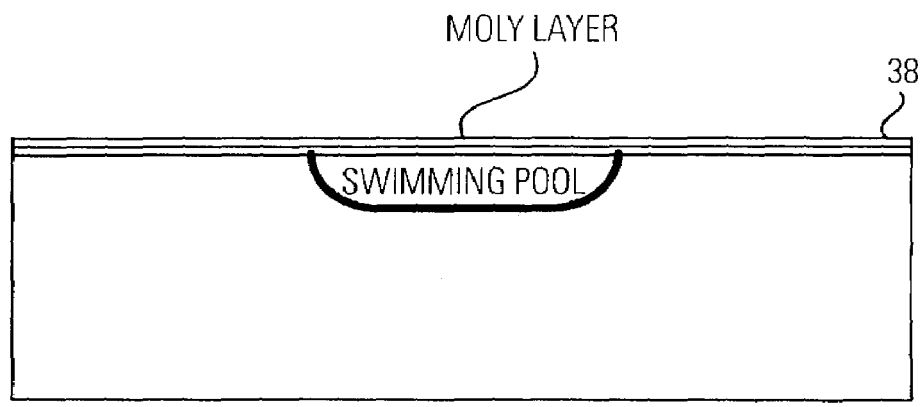

Referring to FIG. 14, a bottom electrode 38 is fabricated by depositing a suitable conductor upon the seed layer 34 by evaporation or other deposition process that produces a layer of conducting material. Preferably, the bottom electrode 38 is formed from a conductive material, such as molybdenum (hereinafter referred to as Mo or moly).

The bottom electrode 38 acts as the bottom electrical contact to the Aluminum Nitride (AlN) acoustic stack. Preferably, the bottom electrode 38 has a thickness in the range of about 1000 Angstroms to about 1 micron.

Figure 15:
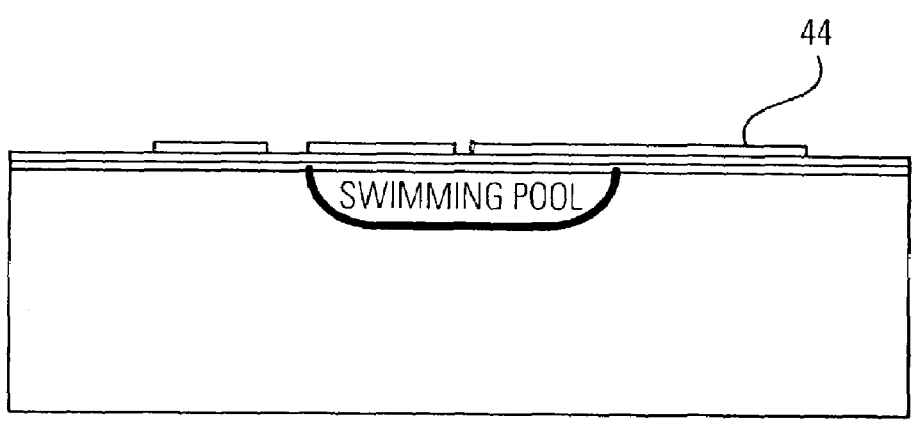

Referring to FIG. 15, a second mask 44 is utilized for patterning the bottom of the FBAR membrane stack and the lead connecting to the contact pads. The second mask 44 defines the bottom contact pad pattern and part of the FBAR stack lateral geometry. The stack geometry controls lateral modes and device capacitance.

Figure 16:
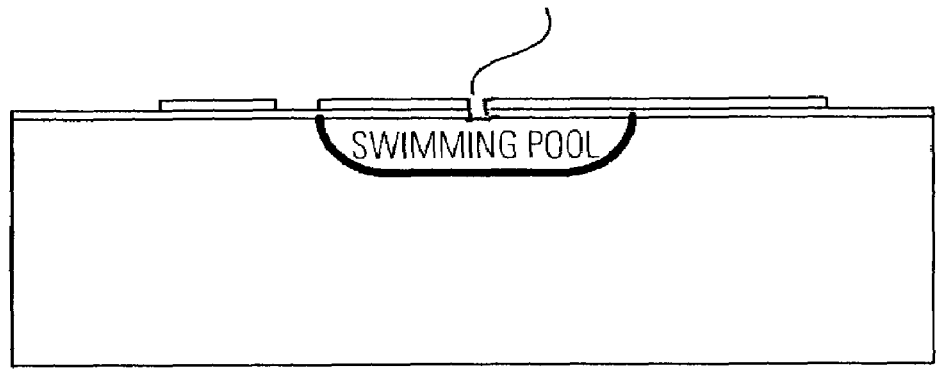

Referring to FIG. 16, portions of the layer of conducting material 38 and a seed layer 34 are then removed by etching or other means, so as to leave the desired pattern of conducting material as the bottom electrode (i.e., patterned seed layer 34 and conducting material layer 38. After the bottom electrode 38 and seed layer 34 are etched, the remaining photoresist is removed (e.g., stripped).

Figure 17:
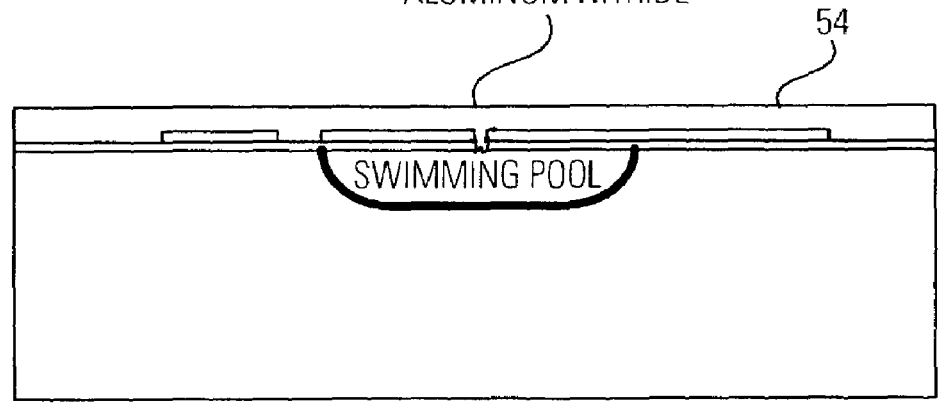

Referring to FIG. 17, a resonating layer 54 is deposited. Preferably, the resonating layer 54 is made from a piezoelectric mono-crystalline resonating material, such as aluminum nitride (AlN). The resonating layer 54 preferably has a thickness in the range of about 1000 Angstroms to about 4 micron.

Figure 18:
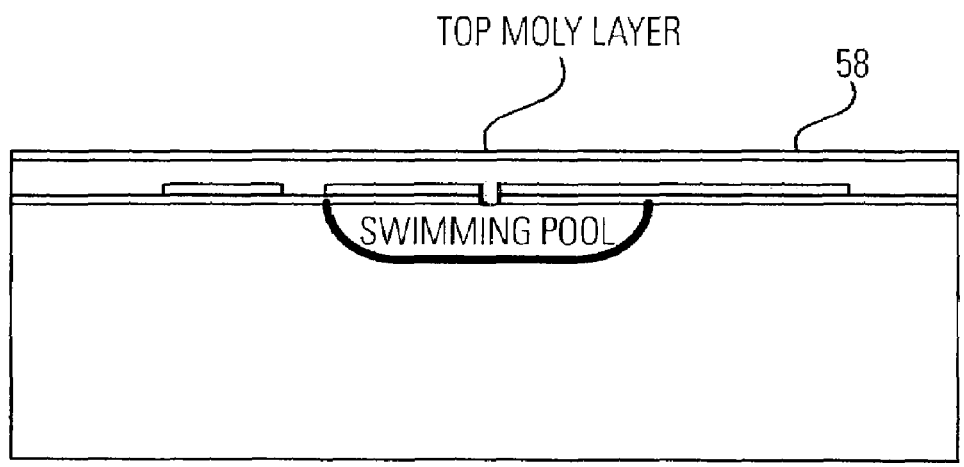

Referring to FIG. 18, a top electrode 58 is deposited and patterned. The top electrode is also preferably constructed from Molybdenum (Mo). The top electrode defines the top contact metal leads to the acoustic stack.

It is known by those of ordinary skill in the art that filter design requires resonators with different frequencies (e.g., resonators of at least two different frequencies). Two commonly utilized filter topologies include a half-ladder design and a lattice design. These designs, for example, can employ a series filter and a shunt filter that typically has a lower frequency than the series filter. The series filter is typically coupled to the output node, and the shunt filter is typically coupled to ground potential.

The processing up to this point, is the same for shunt resonators and series resonators. However, at this point in the processing, mass loading is employed according to the invention to differentiate between shunt resonators and series resonators. In particular, mass loading is employed according to the invention to add mass to the shunt resonator to lower the frequency of the shunt resonator relative to the series resonator. These process steps are referred to herein as "mass loading" processing steps.

Figure 19:
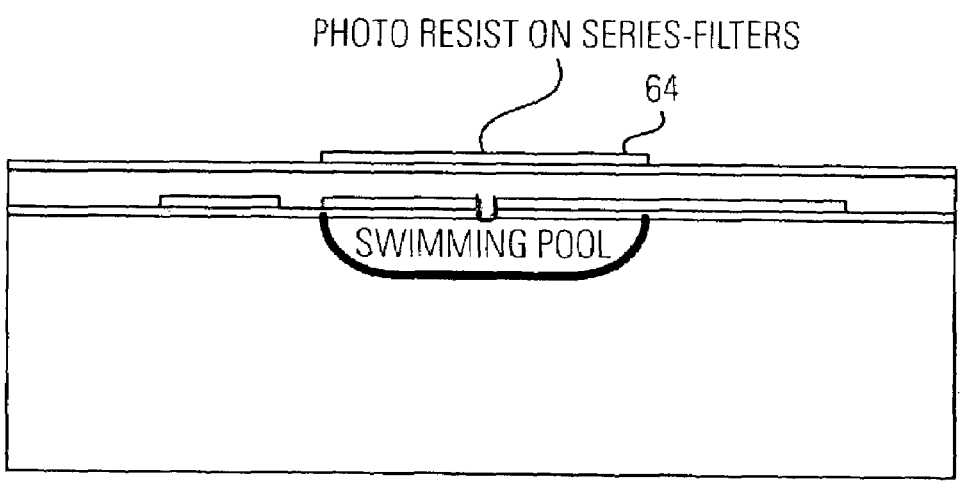

Referring to FIG. 19, the third mask 64 defines a mass load pattern. The third mask 64 is preferably a dark field mask that includes positive photo resist. The third mask 64 for defining a mass load pattern is applied to the top electrode 58. For example, the third mask 64 can include photo resist that is applied to the top electrode 58 except on the shunt filters.

As noted previously, the processing of the shunt resonators involve mass loading, while the processing of series resonators do not involve mass loading. The mass load pattern for the shunt filter component has more mass by the amount of Mo to be deposited in the next step. The more mass allows the shunt filters to resonate at a different frequency than the series filters as discussed previously.

Figure 20:
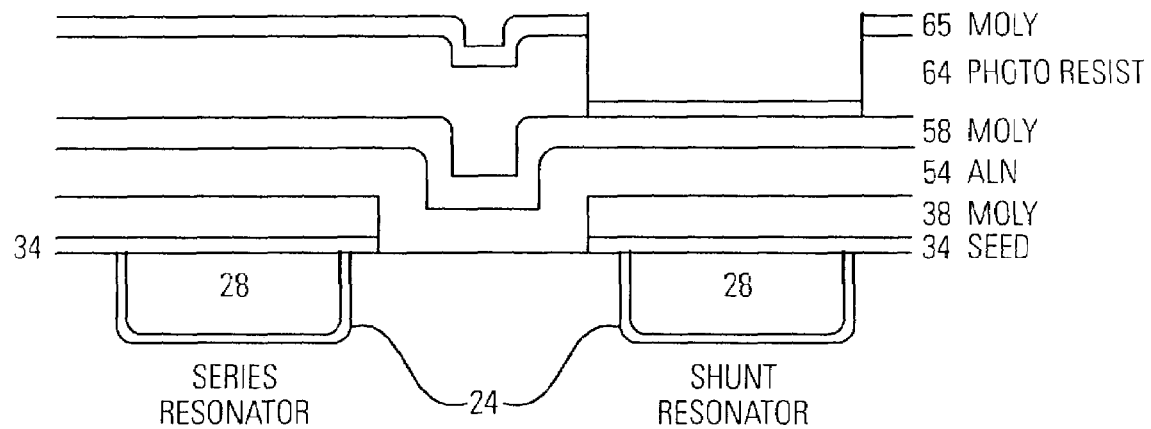
Figure 21:
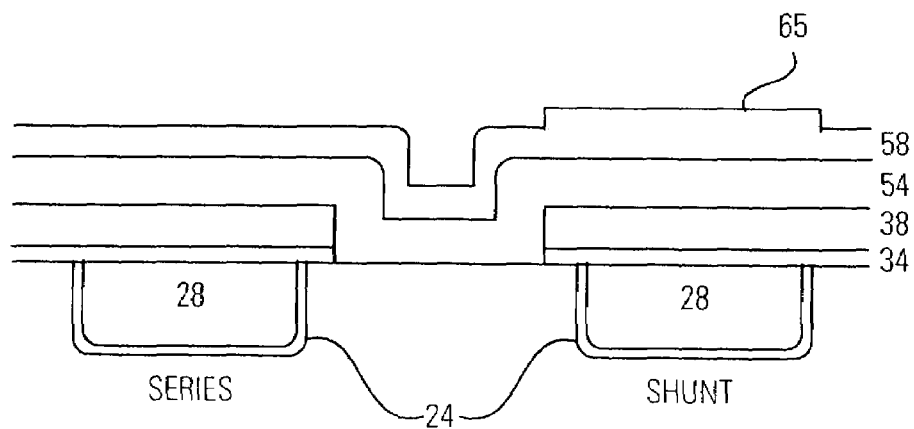

FIGS. 20 and 21 illustrate mass loading process steps in accordance with one embodiment of the invention. Referring to FIG. 20, mass loading layer 65 is deposited on the third mask 64 with the mass load pattern. Referring to FIG. 21, lift-off of the mass loading is performed. A lift-off technique is employed in order to reduce the possibility of altering the mass of the bypass filter either by attacking it or leaving a residue after etching. Referring again to FIG. 21, after etching, a portion 65 of the mass loading layer above the shunt resonator remains, while the mass loading portion above the series resonator is etched away.

Figure 22:
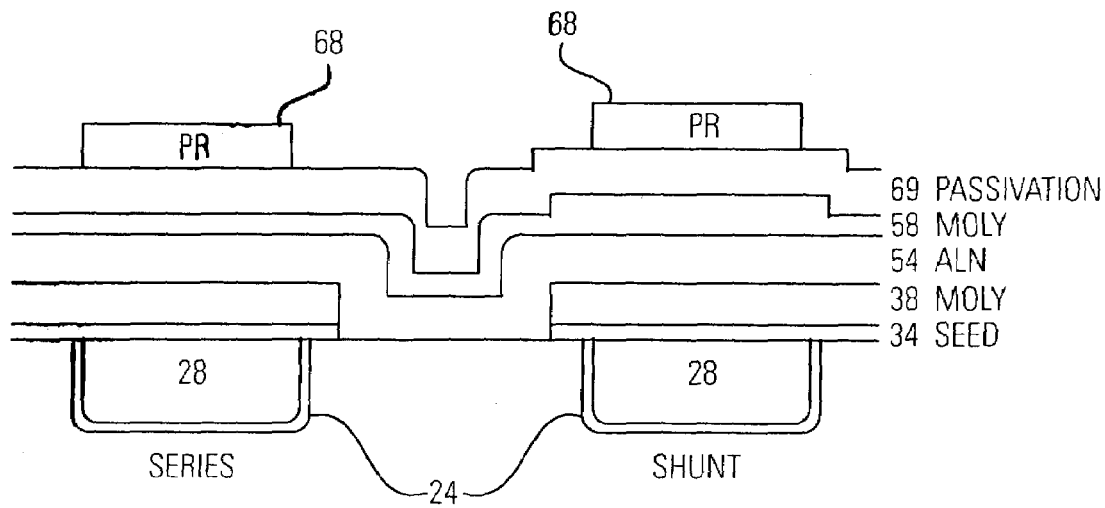

Referring to FIG. 22, a "capping" layer or passivation layer 69 is deposited over the whole wafer. Specifically, after the processing step of lift-off of the mass loading (see FIG. 21), a capping layer 69 may be deposited. A mask 68 is then utilized to pattern and etch the capping layer 69. The capping layer 69 can be, for example, but is not limited to AlN, TiN, silicon, chrome, silicon nitride ($Si_3N_4$) or any other suitable material or combination of materials. The purpose of this "capping layer" 69 is to form a passivation layer.

If the capping layer 69 is deposited prior to the patterning of the top electrode (e.g., a Mo electrode), this layer 69 can also act as a "hard mask" for use in etching the top electrode. Since photoresist is known to recede (or pull back) during long dry etches, this hard mask 69, which is made from a material different from photoresist, can be employed to achieve a very accurate area definition, thereby providing an advantage over the use of photoresist. An accurate area definition is important since the area of the top electrode defines the impedance of the device.

Referring again to FIG. 22, a chlorine gas may be utilized to etch the hard mask (i.e., the passivation layer 69). The $SF_6$ gas may then used to etch the top electrode (e.g., top Mo electrode). In this manner, a separate photoresist mask is not needed.

In the preferred embodiment, the mask 68 (e.g., a photoresist mask pattern 68) is employed to first pattern the capping layer 69 into a hard mask. The hard mask 69 is the utilized as a mask to pattern the top electrode layer 58. The mask 68, hard mask 69, and top electrode 58 are then etched away.

Figure 23:
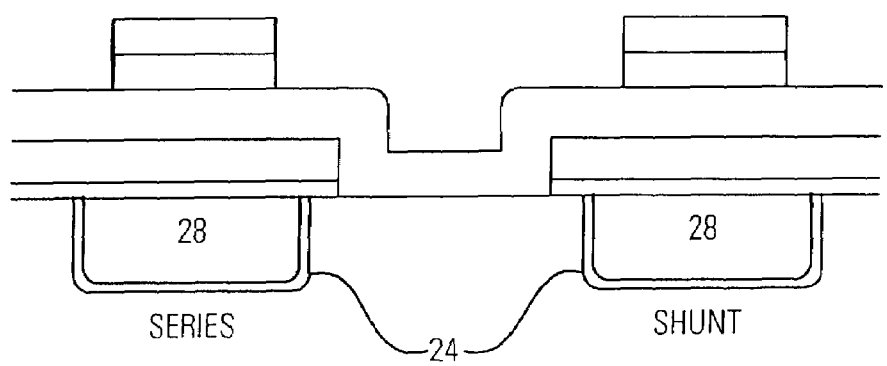

FIG. 23 shows the profile of the resonator stacks after the hard mask etch and the top electrode etch. It is noted that the thickness of the top Mo layer over the series resonator is slightly less than the thickness of the top Mo layer over the shunt resonator.

Figure 23A:
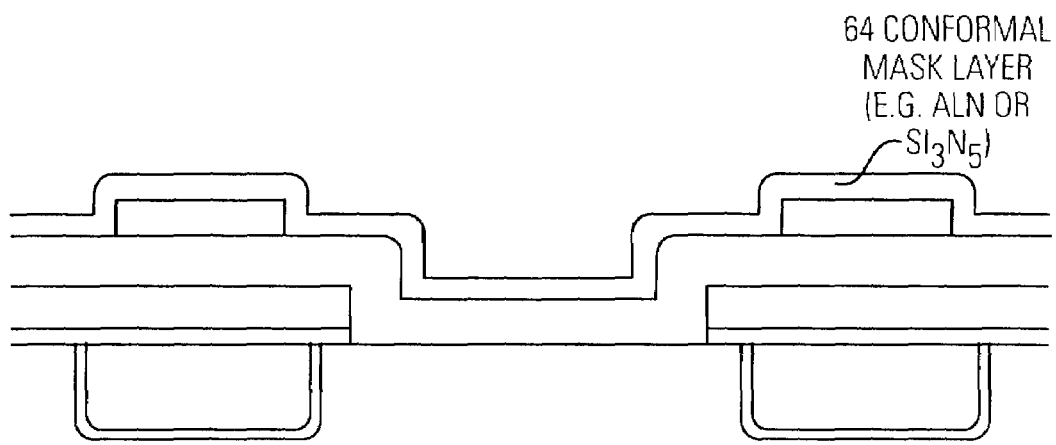

Referring to FIG. 23A, in an alternative embodiment, the passivation layer 69 is first patterned and then the top electrode (e.g., the top Mo electrode) for both series and shunt resonators are etched. A blanket layer of passivation 46 (herein referred to as a conformal passivation layer) is then deposited. The conformal passivation layer 46 is an insulator and is preferably aluminum nitride AlN or silicon nitride. This conformal passivation layer 46 can be patterned simultaneously with the patterning of the thick piezo electric layer (e.g., an AlN layer 54 described hereinbelow).

In another embodiment, the processing after depositing the AlN layer 54, deposits a Mo layer everywhere. Then, the AlN layer 54 and the Mo layer are patterned and etched by employing a layer of photoresist that protects the Mo over the shunt resonator areas. A dry etch can be utilized to remove the Mo from the series resonator areas. The top electrode 58 is then deposited and patterned.

Figure 24:
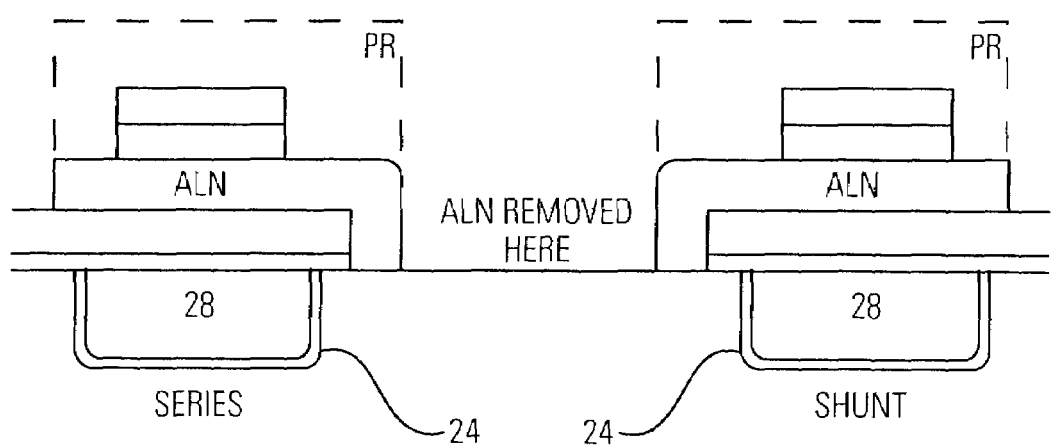
Figure 25:
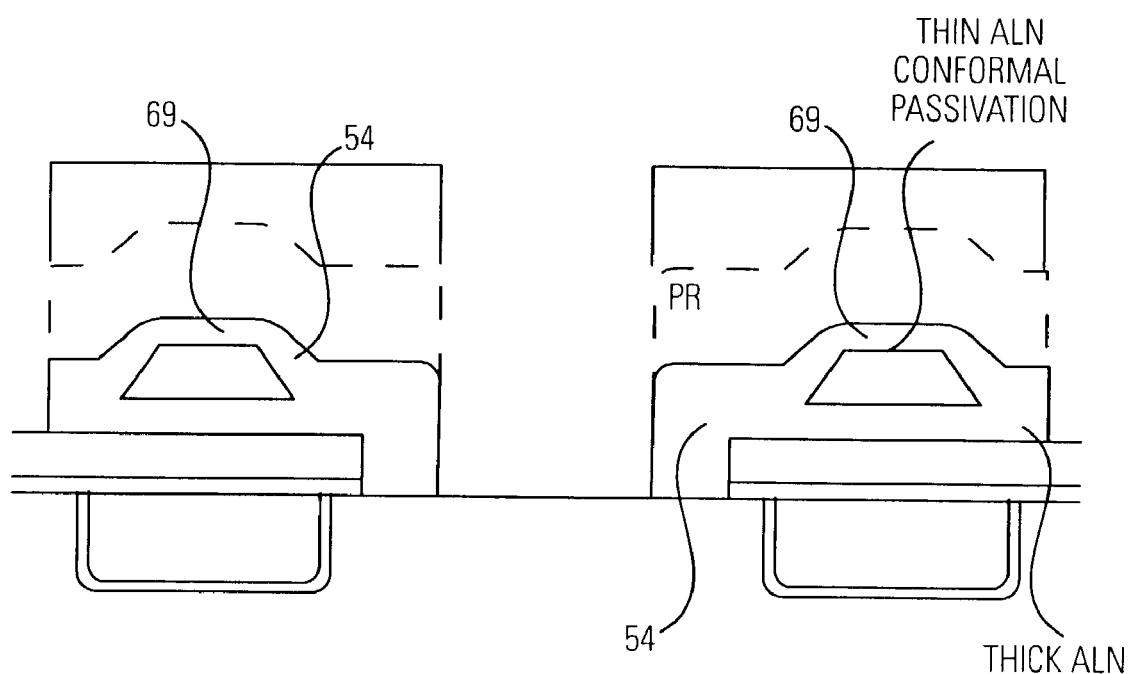

Referring to FIG. 24, a mask (e.g., a photoresist (PR) mask) for use in etching the AlN layer 54 is applied. The mask defines the AlN layer etch and specifies where the AlN is to remain. The mask is preferably a dark field mask that includes positive photo resist. The AlN layer 54 is then etched (e.g., with a dry etch) by utilizing the mask, and the remaining photoresist of the mask is then stripped.

Figure 26:
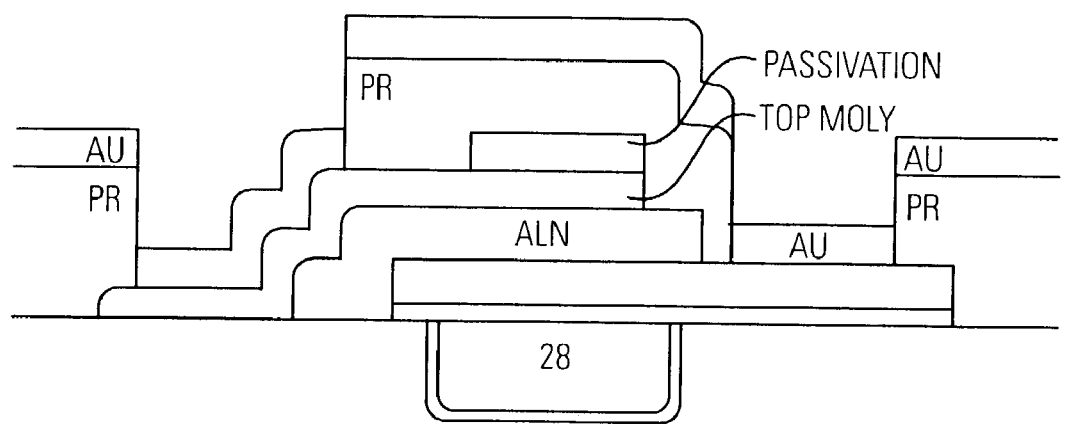
Figure 27:
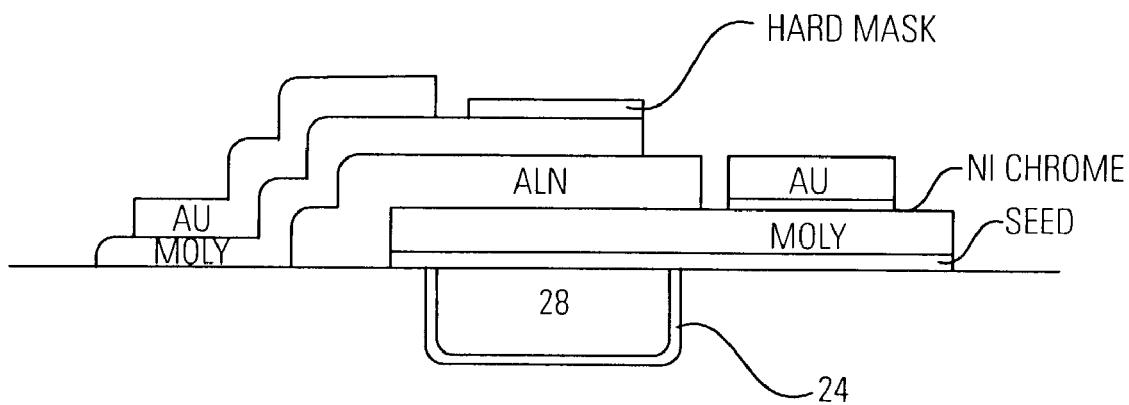
Figure 28:
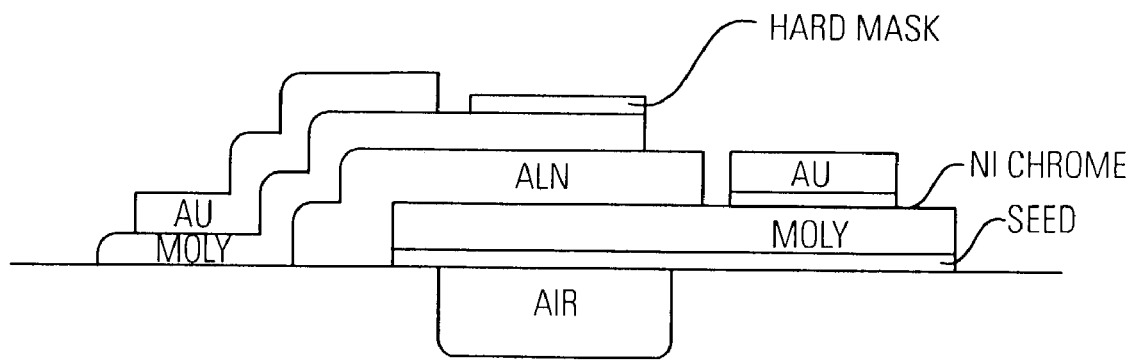

Referring to FIG. 26, a mask for patterning the bond pads and gasket seals is applied. Referring to FIG. 27, NiCr/Au evaporation is performed. The gold is used as the bonding material for the wire bonds used in the die attach. However, gold tends to diffuse into other materials very readily and at low temperatures. To inhibit this, the process, according to the invention, preferably deposits a "barrier" layer. The barrier layer can be, for example, made from TiW, Nickel, Nickel Chrome (or NiCr). This barrier layer is typically between 300 and 1000A thick.

Referring to FIG. 27, pad lift-off is performed where metal in the field is lift-off leaving bond pads and gasket contact patterns. Referring again to FIG. 28, the PSG in the swimming pool is then etched away. For example, the wafer may be soaked in a 10:1 HF solution to etch the PSG in the swimming pool. The result of this step is that the FBAR membrane is suspended in air as the PSG is released from the swimming pool.

Conformal Passivation Layer

The conformal passivation layer may be made from AlN and as noted previously serve both as a hard mask and a passivation layer during the processing. It is noted that the conformal passivation layer may be made from other materials, such as TiN, Si3N4, diamond or other materials that makes layer 54 suitable to be both a hard mask and passivation layer. First, the passivation layer (hard mask) are patterned. The passivation layer may be patterned at the same time as the top electrode (e.g., top Mo electrode) is patterned without the need for an additional new mask. Alternatively, the passivation layer can be deposited after the top electrode has been patterned (e.g., after the processing of FIG. 23).

In reactive ion etching (RIE), gases are utilized to etch the Mo layer. The gas $SF_6$ does not attack the AlN. Thus, the AlN is referred to as the "hard mask." Referring to FIG. 25, in an alternative embodiment, the conformal passivation layer is etched at the same time that the AlN layer is etched. For example, the conformal passivation layer may be patterned during the etch of the AlN layer 54.

Various modifications to the present invention will become apparent to those skilled in the art from the foregoing description and accompanying drawings. Accordingly, the present invention is to be limited solely by the scope of the following claims.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A method for fabricating an acoustical resonator on a substrate having a top surface, said method comprising steps of:
   a) generating a depression in said top surface;
   b) filling said depression with a sacrificial material, said filled depression having an upper surface level with said top surface of said substrate;
   c) depositing a first electrode on said upper surface;
   d) depositing a layer of piezoelectric material on said first electrode; and
   e) depositing a second electrode on said layer of piezoelectric material using a mass load lift-off process; wherein the mass load lift-off process utilizes a mass load pattern and a mass load.

2. The method of claim 1 further comprising:
   depositing a passivation layer for protecting the second electrode.

3. The method of claim 1 wherein the step of depositing a second electrode on said layer of piezoelectric includes
   depositing conductive material;
   depositing an AlN layer;
   applying a mass load layer;
   applying a photoresist layer over at least one shunt resonator;
   etching the mass lead layer and AlN layer to form the second electrode leaving the mass lead layer over the shunt resonator.

4. The method of claim 1 wherein the step of depositing a first electrode on said tipper surface comprises the steps of:
   depositing a seed layer;
   depositing a conductive material;
   applying a patterned mask; and
   etching the conductive material and seed layer in accordance with the patterned mask to form a bottom electrode.

5. The method of claim 4 further comprising the steps of:
   applying a lift-off pattern;
   depositing lift-off conductive material for bond pads;
   lifting off the conductive material leaving bond pads; and
   releasing material from swimming pool.

6. The method of claim 1 wherein the step of depositing a second electrode on said layer of piezoelectric comprises the steps of:
   depositing conductive material;
   applying the mass load pattern;
   depositing the mass load;
   lifting off the mass load;
   applying a patterned mask; and
   etching conductive material in accordance with the patterned mask to form the second electrode.

7. The method of claim 1 wherein the step of depositing a second electrode on said layer of piezoelectric comprises the steps of:
   depositing conductive material;
   applying the muss load pattern;
   depositing the mass load;
   lifting off the mass load;
   depositing a hard mask layer;
   etching the hard mask layer;
   etching the conductive material in accordance with the hard mask to form the second electrode.

8. The method of claim 1 further comprising the steps of:
   etching the piezoelectric layer.

9. A method for fabricating an acoustical resonator on a substrate having a top surface, said method comprising steps of:
   forming a swimming pool in the substrate;
   forming a bottom electrode;
   forming a piezoelectric layer;
   forming a top electrode by
   depositing a conductive material;
   applying a mass load pattern;
   depositing a mass load;
   lifting off the mass load;
   applying a patterned mask; and
   etching conductive material in accordance with the patterned mask to form the top electrode.

10. A method for fabricating a shunt acoustical resonator and a series acoustical resonator on a substrate having a top surface, said method comprising:
    forming the shunt acoustical resonator;
    forming the series acoustical resonator;
    utilizing mass loading to lower the frequency of the shunt resonator relative to the series resonator.

11. The method or claim 10 wherein utilizing mass loading to lower the frequency of the shunt resonator relative to the series resonator includes adding mass to the shunt resonator to differentiate the frequency of the shunt resonator from the frequency of the series resonator.

* * * * *

UNITED STATES PATENT AND TRADEMARK OFFICE
CERTIFICATE OF CORRECTION

PATENT NO. : 7,275,292 B2
APPLICATION NO. : 10/384199
DATED : October 2, 2007
INVENTOR(S) : Richard Ruby It is certified that error appears in the above-identified patent and that said Letters Patent is hereby corrected as shown below:

Col. 10 Line 15 In Claim 3, delete "lead" and insert -- load --, therefor.

Col. 10 Line 16 In Claim 3, delete "lead" and insert -- load --, therefor.

Col. 10 Line 19 In Claim 4, delete "tipper" and insert -- upper --, therefor.

Col. 10 Line 45 In Claim 7, delete "muss" and insert -- mass --, therefor.

Col. 12 Line 1 In Claim 11, delete "or" and insert -- of --, therefor.

Signed and Sealed this

Twenty-fourth Day of February, 2009

JOHN DOLL
*Acting Director of the United States Patent and Trademark Office*